United States Patent [19]
Fox et al.

[11] Patent Number: 6,087,686
[45] Date of Patent: Jul. 11, 2000

[54] PIXEL WITH BURIED CHANNEL SPILL WELL AND TRANSFER GATE

[75] Inventors: Eric Fox; Nixon O., both of Waterloo, Canada

[73] Assignee: Dalsa, Inc., Canada

[21] Appl. No.: 09/220,758

[22] Filed: Dec. 28, 1998

Related U.S. Application Data

[60] Provisional application No. 60/068,866, Dec. 29, 1997.

[51] Int. Cl.[7] ......................... H01L 27/148; H01L 29/768
[52] U.S. Cl. .......................... 257/233; 257/234; 257/236; 257/249
[58] Field of Search .................................. 257/225, 233, 257/234, 236, 249

[56] References Cited

U.S. PATENT DOCUMENTS

| | | |
|---|---|---|
| 4,814,848 | 3/1989 | Akimoto et al. . |
| 4,980,735 | 12/1990 | Yamawaki . |
| 5,003,565 | 3/1991 | Yoshida ...................................... 377/60 |
| 5,070,380 | 12/1991 | Erhardt et al. . |
| 5,181,093 | 1/1993 | Kawaura . |
| 5,191,399 | 3/1993 | Maegawa et al. . |
| 5,235,196 | 8/1993 | Anagnostopoulos et al. . |
| 5,514,887 | 5/1996 | Hokari . |
| 5,625,210 | 4/1997 | Lee et al. . |
| 5,698,874 | 12/1997 | Hayashi .................................. 257/233 |
| 5,699,114 | 12/1997 | Park . |
| 5,986,297 | 11/1999 | Guidash et al. ........................ 257/223 |

*Primary Examiner*—Ngân V. Ngô
*Attorney, Agent, or Firm*—Banner & Witcoff, Ltd.

[57] ABSTRACT a pixel is formed in a substrate having a first conductivity type, the pixel being coupled to a register for output. The pixel includes a pixel channel of a second conductivity type formed in the substrate, a transfer gate electrode, a storage gate electrode and a photodiode. The pixel channel includes a transfer portion at a first end of the pixel channel proximal to the register, a diode portion at a second end distal to the register and a storage portion between the transfer portion and the diode portion. The transfer gate electrode is insulatively spaced over the transfer portion, and the storage gate electrode is insulatively spaced over the storage portion. The diode is formed within the diode portion using the storage gate electrode as a mask.

20 Claims, 3 Drawing Sheets

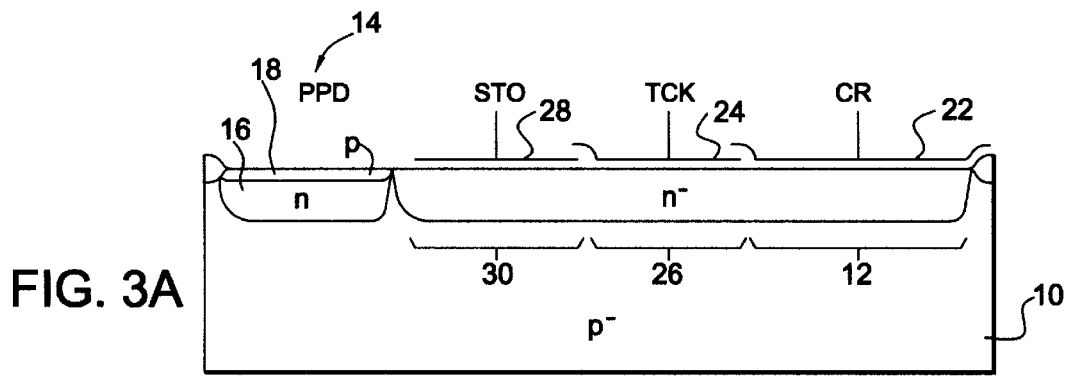
FIG. 3A
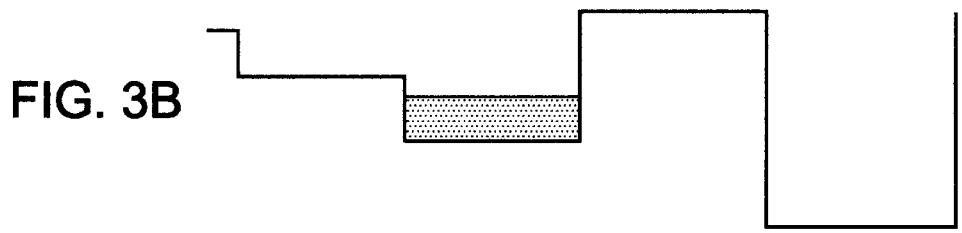
FIG. 3B
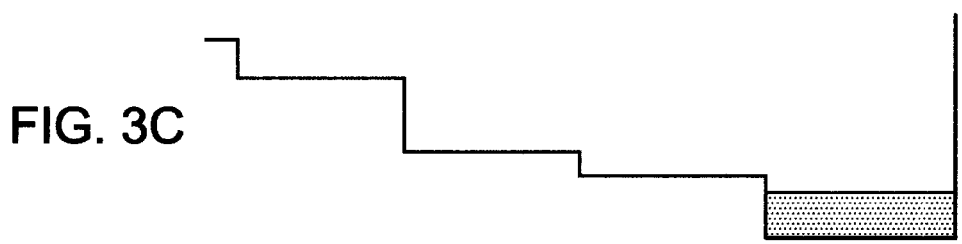
FIG. 3C
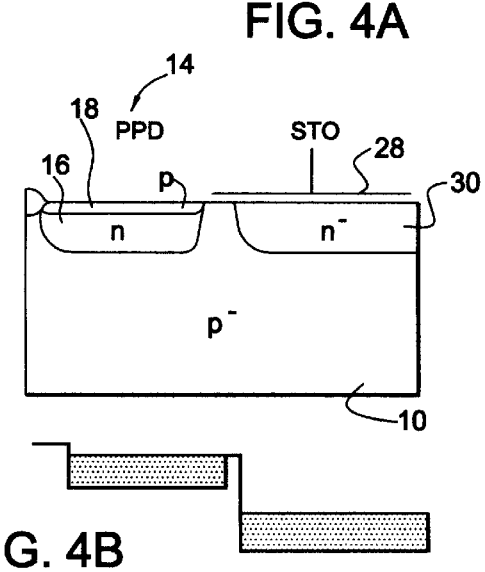
FIG. 4A
FIG. 4B
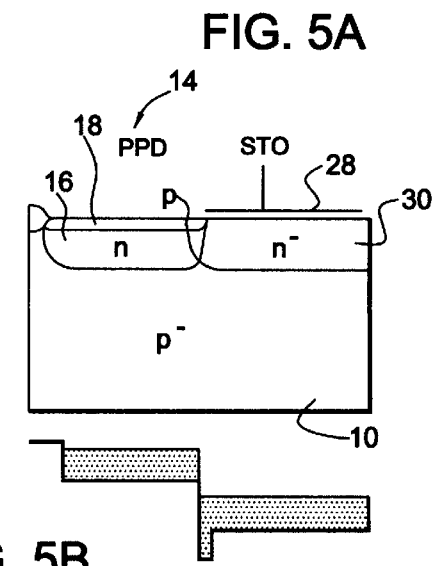
FIG. 5A
FIG. 5B

PIXEL WITH BURIED CHANNEL SPILL WELL AND TRANSFER GATE

The priority benefit of the Dec. 29, 1997 filing date of U.S. Provisional application number 60/068,866 is hereby claimed.

BACKGROUND OF THE INVENTION

1. Field of the Invention

The present invention relates to a pixel structure of a charge coupled device sensor (CCD sensor). In particular, the invention relates to a spill well structure disposed between a pinned photo diode (PPD) of the pixel and an output register.

2. Description of Related Art

A known PPD pixel is illustrated in FIGS. 1A, 1B, 2A, 2B and 2C. In FIG. 1A, the serial output register channel is formed by n⁻ implants 12 in p⁻ substrate 10. In FIG. 1B, a film of polycrystalline silicon (hereinafter, poly) is deposited on the substrate, patterned and etched to form gate electrodes 22 for the serial output register (a three phase register is shown) and transfer gate electrode 24. Then, pinned photo diode (PPD) 14 is formed by n implants and p implants. The p implant region contacts substrate 10 so the p implant region of the PPD becomes "pinned" to the potential of the substrate (for reference, call it 0 volts). These PPD implants are introduced after the poly is patterned, and are therefore, self aligned to the edge of the poly that forms the transfer gate electrode 24 (the TCK gate). In FIG. 2A (a section through FIG. 1B), transfer gate electrode 24 is insulatively spaced over the substrate, and the TCK gate channel (below gate electrode 24) is configured as a surface channel FET. The serial output register is configured as a buried channel register by virtue of the n⁻ implant.

In this configuration, photo charge is produced in the PPD photosite (the p region on the n region). Following integration of photo charge in the PPD (FIG. 2B), the photo charge is transferred across the surface channel created below the TCK gate electrode by the application of a positive volt signal TCK to the well created beneath serial register gate electrode 22 by the application of a positive clock signal CR. This configuration is favored when charge is stored in the PPD since PPD channel potentials (PPD region 16) are never larger than a few volts. In FIGS. 2B and 2C, and other figures showing a potential profile, down is interpreted to mean more positive potential, and in descriptions, a greater potential is used to mean a more positive potential that is depicted in the figures as further down. Thus, in FIGS. 2B and 2C, the PPD potential of a few volts (i.e., a few volts positive) is depicted as a well with a bottom slightly down from the zero potential level of the substrate. When charge is held in the PPD, the PPD well is partly filled with charge. Since the charge is formed from electrons with a negative charge, this reduces the potential of the PPD and the top of the charge, as depicted in FIG. 2B, is closer to the zero potential of the substrate than is the bottom of the well. When zero volts are applied to TCK gate electrode 24, the channel potential beneath the TCK gate electrode is also zero volts. Hence, the barrier to lateral charge transfer (between the PPD and the serial output register) is not smaller than the barrier to charge leakage from the PPD to anywhere else on the substrate (assume zero volts on the substrate). In this way, the PPD charge handling capacity is maximized.

The drawbacks of this architecture are the large voltage that may have to be applied to the TCK gate electrode to increase the channel potential beneath the TCK gate electrode sufficiently to fully empty the PPD (see FIG. 2C), and the fact that the surface channel region just below the TCK gate electrode may trap charge at the surface during the charge transfer process. This type of TCK gate needs to be a surface channel gate (not buried channel gate) so that it can act as barrier to the transfer of charge stored in the PPD during the integration period (see FIG. 2B). If the TCK gate were a buried channel gate, the channel beneath the TCK gate electrode would become pinned (i.e., fixed to a constant potential) before its potential could be made sufficiently low (i.e., sufficiently negative) to act as a barrier to charges (i.e., photo-electrons) in the PPD.

Unlike the PPD, the surface channel beneath the TCK gate electrode does not receive an n type implant. In a practical fabrication process, the n type implant of the PPD diffuses away from the PPD to dope a small portion of the surface channel that is beneath the TCK gate electrode and adjacent to the PPD. This small portion of the channel beneath the TCK gate electrode with the diffused n type dopant will have a different (and more positive) channel potential than the rest of the surface channel beneath the TCK gate electrode. This small portion with a more positive channel potential forms a well that constitutes a trap for photo-electrons in the image area. A larger (more positive) TCK "on" voltage must be applied to the TCK gate electrode during the time depicted by (FIG. 2C) in order to "fringe out" this trap.

U.S. Pat. No. 4,980,735 to Yamawaki shows a photo diode region 10, a CCD region 30 and a storage region 20 coupled therebetween. Photo diode region 10 has an impurity concentration N1, and CCD region 30 has an impurity concentration N2. Storage region 20 has an impurity concentration of N1+N2. The increased concentration (N1+N2) of the storage region contributes to its intrinsic positive potential that helps it store electron charge. However, this storage region does not have a gate electrode to help it induce additional positive potential.

SUMMARY OF THE INVENTION

A pixel of the present invention includes a spill well photosite that has a pinned photo diode (PPD), with or without a separate spill well gate electrode, and buried channel storage and transfer gates. The photo charge is generated in a PPD and immediately spills across a spill gate into an adjacent charge storage well. The spill gate and storage gate may be formed by a single gate electrode. The spill architecture allows the spill, storage, and transfer regions to be configured as a buried channel. The use of a buried channel allows for efficient charge transfer without the need for large gate voltages or long transfer times. In a configuration of the invention, the buried channel is continued into the PPD region. This eliminates any interface between the spill well and the PPD and thereby reduces the likelihood of pocket/barrier formation between the PPD and the storage well and makes the PPD/spill gate region entirely self aligned to the spill well gate.

It is an object to the present invention to provide a pixel structure that includes a pinned photo diode (PPD) and spill well and has both a larger well capacity and superior lag performance when compared to conventional pixel structures. It is a further object of the present invention to provide a pixel structure that can be made in such a way as to be insensitive to process variations such as alignment variations.

These and other objects are achieved in a pixel that is formed in a substrate having a first conductivity type, the pixel being coupled to a register for output. The pixel includes a pixel channel of a second conductivity type formed in the substrate, a transfer gate electrode, a storage gate electrode and a photo diode. The pixel channel includes a transfer portion at a first end of the pixel channel proximal to the register, a diode portion at a second end distal to the register and a storage portion between the transfer portion and the diode portion. The transfer gate electrode is insulatively spaced over the transfer portion, and the storage gate electrode is insulatively spaced over the storage portion. The diode is formed within the diode portion using the storage gate electrode as a mask.

BRIEF DESCRIPTION OF DRAWINGS

The invention will be described in detail in the following description of preferred embodiments with reference to the following figures wherein:

FIG. 3A is a section view of a pixel according to an embodiment of the present invention;

FIG. 3B is a potential profile of the pixel of FIG. 3A while charge is accumulating in the PPD;

FIG. 3C is a potential profile of the pixel of FIG. 3A while charge is transferred from the PPD;

FIG. 4A is a section view of a portion of the pixel of FIG. 3A where an alignment error creates a barrier;

FIG. 4B is a potential profile of the pixel of FIG. 4A showing charge in the PPD unable to pass by the barrier;

FIG. 5A is a section view of a portion of the pixel of FIG. 3A where an alignment error creates a deep well;

FIG. 5B is a potential profile of the pixel of FIG. 5A showing charge in the storage well that cannot be transferred to the serial output register;

DETAILED DESCRIPTION OF PREFERRED EMBODIMENTS

Figure 1A:
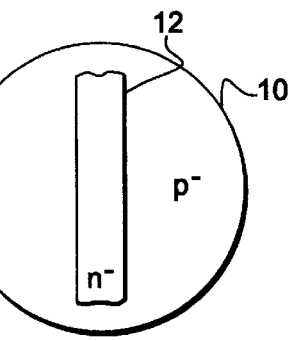
FIG. 1A is a plan view of a substrate with a known pixel before gate electrodes are formed.
Figure 1B:
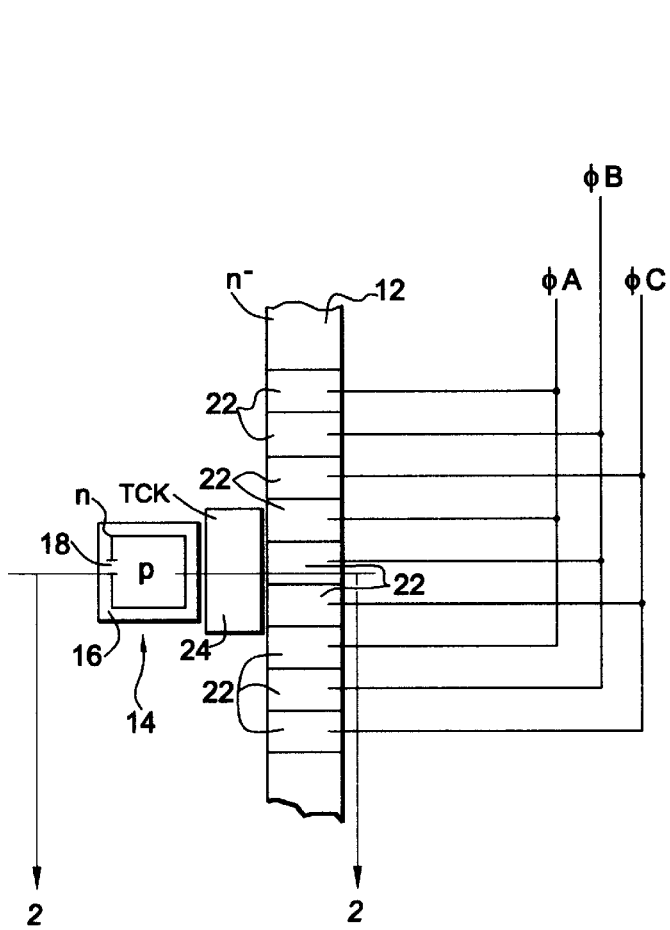
FIG. 1B is a plan view of a substrate with a known pixel after gate electrodes and a PPD are formed.
Figure 2A:
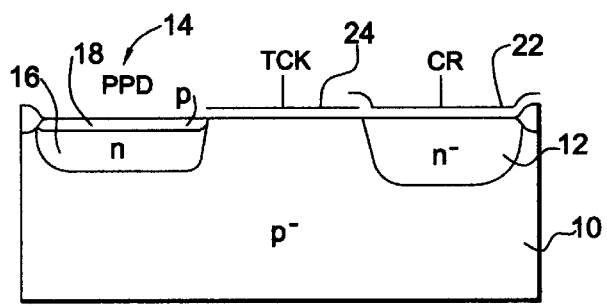
FIG. 2A is a section view of the pixel of FIG. 1B.
Figure 2B:
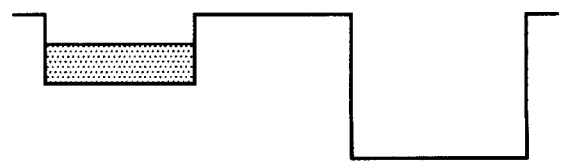
FIG. 2B is a potential profile of the pixel of FIG. 2A while charge is accumulating in the PPD.
Figure 2C:
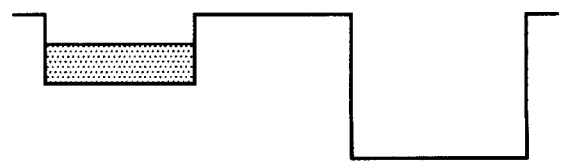
FIG. 2C is a potential profile of the pixel of FIG. 2A while charge is transferred from the PPD.

These issues can be resolved by configuring the pixel as in FIG. 3A with performance show in FIGS. 3B and 3C. In this architecture, a pixel channel of n⁻ conductivity type is formed in substrate 10 of p⁻ conductivity type that extends from the PPD to the serial output register channel 12. The pixel channel includes transfer portion 26 and storage portion 30. A transfer gate is formed by insulatively forming transfer gate electrode 24 over transfer portion 26. A storage gate is formed between the PPD and the transfer gate by insulatively forming storage gate electrode 28 over storage portion 30.

In operation, the channel potential in storage portion 30 is always maintained at a level greater than the PPD channel potential such that charge generated by the absorption of light in the PPD immediately transfers to storage portion 30 (FIG. 3B). In FIG. 3B, charge is accumulated in storage portion 30 while transfer portion 26 is maintained at a low potential to serve as a barrier. In FIG. 3C, a high potential is applied to TCK gate electrode 24 to permit charge that has accumulated in storage portion 30 to transfer into the output register.

When the storage well is configured as a buried channel as depicted in FIG. 3B, the potential of the storage portion of the pixel channel can be higher than the potential of the PPD even when the storage gate electrode is biased to the substrate bias due to the impurity doping of the n conductivity type within the pixel channel. A typical channel potential for zero volts applied to a buried channel FET is between 6 and 10 volts, and therefore, can be higher than the PPD channel potential. The charge transfer from the PPD to the storage well can be accomplished without the charge ever approaching the surface region and therefore should be very efficient. An additional advantage is that the storage well can occupy more area than the PPD photosite by extending its width wider than the diode or transfer gate. Therefore, the photosite can be configured for any desired well capacity (i.e., the pixel capacity can exceed the PPD photosite capacity). Furthermore, the storage capacity becomes independent of the PPD channel potential which makes this architecture more tolerant of process variations in the implants used to produce the PPD.

In a first variant, a pixel is formed in substrate 10, the substrate having a p conductivity type, and the pixel is coupled to a register for output. The pixel includes a pixel channel of an n conductivity type formed in substrate 10. The pixel channel includes transfer portion 26 at a first end proximal to the register and storage portion 30 adjacent to the transfer portion. The pixel also includes transfer gate electrode 24 insulatively spaced over transfer portion 26, and storage gate electrode 28 insulatively spaced over storage portion 30. The pixel also includes pinned photo diode 14 formed using storage gate electrode 28 as a mask.

Diode 14 is a pinned photo diode that includes first region 16 of the n conductivity type, and second region 18 of the p conductivity type, the second region being electrically coupled to the substrate. The impurity concentration of the diode (region 16 of diode 14) is preferably greater than an impurity concentration of storage portion 30 if the pixel channel.

In a variant, the pixel channel defines a longitudinal direction and a width transverse to the longitudinal direction. The diode is characterized by a diode width transverse to the longitudinal direction. In this variant the storage portion is characterized by a storage width transverse to the longitudinal direction that is greater than the diode width. Alternatively, the storage portion may be characterized by a storage length in the longitudinal direction that is greater than a corresponding diode length.

In another variant, the pixel channel further includes a spill well portion disposed between the diode and the storage portion, and the pixel further includes a spill well gate electrode insulatively spaced over the spill way portion. Diode 14 is formed using the spill way gate electrode as a further mask.

There can be an issue with the architecture illustrated in FIG. 3A in that the buried channel n-implant is excluded from the PPD. Since the buried channel n-implant is performed prior to the deposition and patterning of poly, the implant edge at the PPD side of the storage gate is not self aligned to the gate edge. For small misalignments of the buried channel implant relative to the poly edge a pocket or barrier can be formed between the PPD and the storage well as illustrated in FIGS. 4A and 5A.

In FIG. 4A, the buried channel does not extend far enough to contact the diode. This creates a barrier between the PPD and the storage well that cannot be "fringed out" as depicted in FIG. 4B. The PPD cannot be fully emptied of charge.

In FIG. 5A, the buried channel extends too far into the diode. This creates a deep storage well between the PPD and the storage well that cannot be "fringed out" as depicted in FIG. 5B. The storage well cannot be fully emptied of charge.

Figure 6:
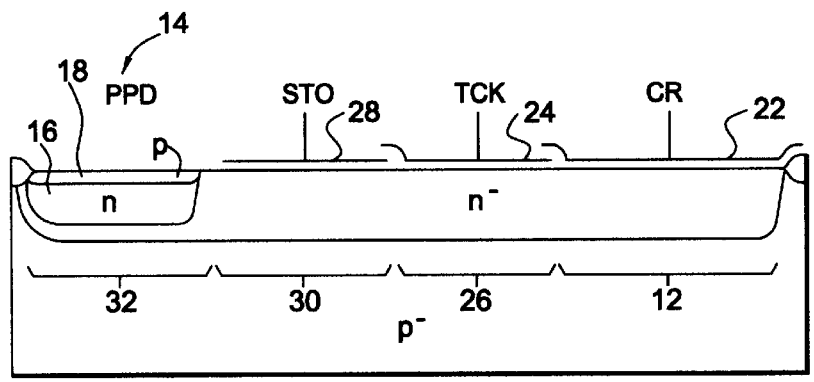
FIG. 6 is a section view of a pixel according to another embodiment of the present invention.
Figure 7:
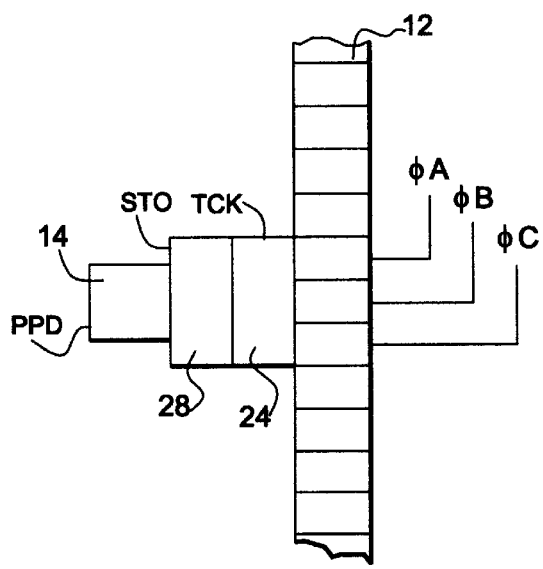
FIG. 7 is a plan view of the pixel of FIG. 3A.
Figure 8:
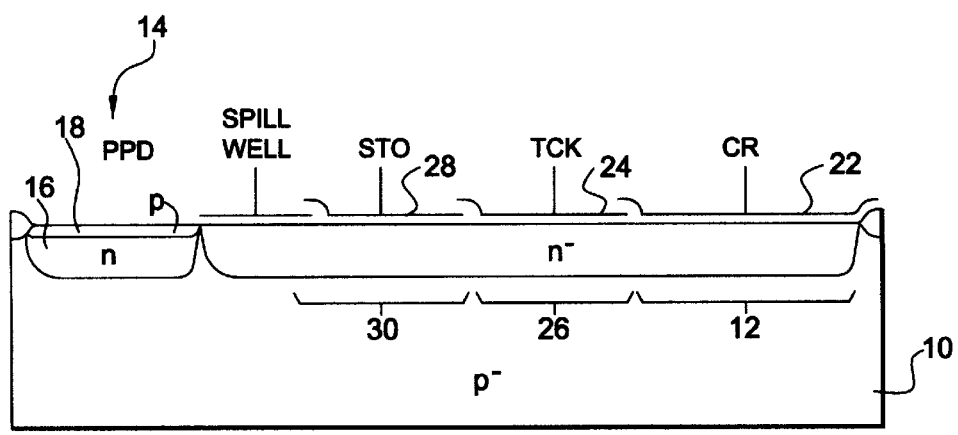
FIG. 8 is a section view of the pixel of FIG. 3A with a spill well.

The issue can be resolved by continuing the n-implant for the buried channel into the PPD as illustrated in FIG. 6. The PPD n-implant is preferably modified (dose made smaller) in order to achieve the same PPD channel potential in diode region 16 as without the buried channel implant.

The aim is to produce a pixel with a PPD in order to provide superior lag performance than that achievable with a conventional photo diode, but with a large well capacity and in such a way as to be insensitive to process variations in the PPD channel potential. This spill well structure resolves this issue.

In general, lag is superior if no pool, pocket or well of electrons exists in the imaging area that cannot be cleared during charge readout. Conventional photo diodes are bottomless pools of electrons and hence cannot be completely cleared during readout. PPDs are pools that have bottoms. Even in a PPD structure, charge pockets can form due to implant alignment errors or the diffusion of certain implants. The methods described in the preceding lines are techniques used to eliminate these charge pockets. The placement of the buried channel implant is a way to decrease performance sensitivity to the alignment of the buried channel implant to the poly edge.

In this variant, the pixel channel further includes diode portion 32 disposed at a second end of the pixel channel distal from the register, and diode 14 is formed within the diode portion of the pixel channel. In this way, unwanted barriers and wells between the PPD and the storage well are eliminated.

Having described preferred embodiments of a novel pixel formed in a buried channel with a storage and spill well architecture and a transfer gate (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What id claimed is:

1. A pixel formed in a substrate, the substrate having a first conductivity type, the pixel being coupled to a register for output, the pixel comprising:

a pixel channel of a second conductivity type formed in the substrate, the pixel channel including a transfer portion at a first end proximal to the register and a storage portion adjacent to the transfer portion;

a transfer gate electrode insulatively spaced over the transfer portion;

a storage gate electrode insulatively spaced over the storage portion; and a diode formed using the storage gate electrode as a mask.

2. The pixel of claim 1, wherein an impurity concentration of the diode is greater than an impurity concentration of the storage portion.

3. The pixel of claim 1, wherein the diode is a pinned photo diode comprised of:

a first region of the second conductivity type;

a second region of the first conductivity type, the second region being electrically coupled to the substrate; and an impurity concentration of the first region is greater than an impurity concentration of the storage portion.

4. The pixel of claim 1, wherein:

the pixel channel defines a longitudinal direction and a width transverse to the longitudinal direction;

the diode is characterized by a diode width transverse to the longitudinal direction; and the storage portion is characterized by a storage width that is greater than the diode width.

5. The pixel of claim 1, wherein the pixel channel further includes a diode portion disposed at a second end of the pixel channel distal from the register, the diode being formed within the diode portion of the pixel channel.

6. The pixel of claim 1, wherein the pixel channel further includes a spill well portion disposed between the diode and the storage portion, the pixel further comprising a spill well gate electrode insulatively spaced over the spill well portion, the diode being formed using the spill well gate electrode as a further mask.

7. A method of using the pixel of claim 1, wherein:

the diode is characterized by an intrinsic diode potential;

a storage voltage is applied to the storage gate electrode so that the storage portion is characterized by an induced storage potential that is greater than the intrinsic diode potential.

8. The method of claim 7, wherein a transfer voltage is applied during an integration period to the transfer gate electrode so that the transfer portion is characterized by an induced transfer potential that is less than the induced storage potential.

9. The method of claim 7, wherein a transfer voltage is applied during a transfer period to the transfer gate electrode so that the transfer portion is characterized by an induced transfer potential that is greater than the induced storage potential.

10. The method of claim 7, wherein:

during a transfer period, a first transfer voltage is applied to the transfer gate electrode so that the transfer portion is characterized by a first induced transfer potential that is greater than the induced storage potential; and during an integration period, a second transfer voltage is applied to the transfer gate electrode so that the transfer portion is characterized by a second induced transfer potential that is less than the induced storage potential.

11. A method of using the pixel of claim 1 comprising a step of applying a storage voltage to a storage gate electrode so that a portion of the channel that is disposed below the storage gate electrode is characterized by an induced storage potential that is greater than an intrinsic diode potential of the diode.

12. The method of claim 11, wherein a transfer voltage is applied during an integration period to a transfer gate electrode so that a portion of the channel that is disposed below the transfer gate electrode is characterized by an induced transfer potential that is less than the induced storage potential.

13. The method of claim 11, wherein a transfer voltage is applied during a transfer period to a transfer gate electrode so that a portion of the channel that is disposed below the transfer gate electrode is characterized by an induced transfer potential that is greater than the induced storage potential.

14. The method of claim 11, wherein:

during a transfer period, a first transfer voltage is applied to a transfer gate electrode so that a portion of the channel that is disposed below the transfer gate electrode is characterized by a first induced transfer potential that is greater than the induced storage potential; and during an integration period, a second transfer voltage is applied to the transfer gate electrode so that a portion of the channel that is disposed below the transfer gate electrode is characterized by a second induced transfer potential that is less than the included storage potential.

15. A method of making the pixel of claim 1 comprising steps of:

in a substrate of a first conductivity type, forming a pixel channel of a second conductivity type, the pixel channel including a transfer portion at a first end proximal to a register for output and a storage portion adjacent to the transfer portion;

depositing a film of polycrystaline silicon;

patterning and etching the film to form a transfer gate electrode insulatively spaced over the transfer portion and a storage gate electrode insulatively spaced over the storage portion; and forming a diode using the storage gate electrode as a mask.

16. The method of claim 15, wherein the diode is formed so that an impurity concentration of the diode is greater than an impurity concentration of the storage portion.

17. The method of claim 15, wherein the step of forming a diode forms a pinned photodiode that includes a first region of the second conductivity type and a second region of the first conductivity type, the second region being electrically coupled to the substrate, an impurity concentration of the first region being greater than an impurity concentration of the storage portion.

18. The method of claim 15, wherein:

the pixel channel defines a longitudinal direction and a width transverse to the longitudinal direction;

the step of forming a diode forms a diode characterized by a diode width transverse to the longitudinal direction; and the step of forming a pixel channel forms the storage portion to be characterized by a storage width that is greater than the diode width.

19. The method of claim 15, wherein:

the step of forming a pixel channel includes forming a diode portion disposed at a second end of the pixel channel distal from the register; and the step of forming a diode forms the diode within the diode portion of the pixel channel.

20. The method of claim 15, wherein:

the pixel channel further includes a spill well portion disposed between the diode and the storage portion;

step of patterning and etching the film further forms a spill well gate electrode insulatively spaced over the spill way portion; and the step of forming a diode forms the diode using the spill well gate electrode as a further mask.

* * * * *